(12) United States Patent
Cheah et al.

(10) Patent No.: US 11,227,841 B2
(45) Date of Patent: *Jan. 18, 2022

(54) STIFFENER BUILD-UP LAYER PACKAGE

(71) Applicant: Intel Corporation, Santa Clara, CA (US)

(72) Inventors: Bok Eng Cheah, Bukit Gambir (MY); Jackson Chung Peng Kong, Tanjung Tokong (MY); Jenny Shio Yin Ong, Bayan Lepas (MY); Seok Ling Lim, Kulim (MY)

(73) Assignee: Intel Corporation, Santa Clara, CA (US)

( * ) Notice: Subject to any disclaimer, the term of this patent is extended or adjusted under 35 U.S.C. 154(b) by 16 days.

This patent is subject to a terminal disclaimer.

(21) Appl. No.: 16/419,683

(22) Filed: May 22, 2019

(65) Prior Publication Data

US 2020/0006253 A1    Jan. 2, 2020

(30) Foreign Application Priority Data

Jun. 28, 2018   (MY) .............................. 2018001203

(51) Int. Cl.
*H01L 23/00*   (2006.01)
*H01L 23/522*  (2006.01)

(52) U.S. Cl.
CPC ........ *H01L 23/562* (2013.01); *H01L 23/5226* (2013.01)

(58) Field of Classification Search
CPC .......................... H01L 23/562; H01L 23/5226
See application file for complete search history.

(56) References Cited

U.S. PATENT DOCUMENTS

| | | | | |
|---|---|---|---|---|
| 5,866,943 A * | 2/1999 | Mertol | .................... | H01L 23/36 257/659 |
| 5,880,590 A * | 3/1999 | Desai | ................. | G01R 1/07314 174/261 |
| 7,842,541 B1 * | 11/2010 | Rusli | ................. | H01L 23/49816 438/106 |
| 2001/0013654 A1 * | 8/2001 | Kalidas | ............. | H01L 23/49838 257/738 |
| 2003/0156400 A1 * | 8/2003 | Dibene, II | ............. | H05K 3/368 361/803 |

(Continued)

*Primary Examiner* — Nathan W Ha
(74) *Attorney, Agent, or Firm* — Schwegman Lundberg Woessner, P.A.

(57) ABSTRACT

To maintain the integrity of electrical contacts at a build-up layer of a chip package, while reducing electrical interference caused by a chip connected to the build-up layer, the chip package can include a stiffener formed from an electrically conductive material and positioned between the chip and the build-up layer. The chip can electrically connect to the build-up layer through electrical connections that extend through the stiffener. Compared with a stiffener that extends only over a single chip of the chip package, the present stiffener can help prevent warpage or other mechanical deformities that can degrade electrical contacts away from the chip at the build-up layer. Compared with a stiffener that extends only over an area away from the chip, such as a peripheral area, the present stiffener can help reduce electrical interference in an area of the build-up layer near the chip.

20 Claims, 16 Drawing Sheets

(56) References Cited

U.S. PATENT DOCUMENTS

| | | | | |
|---|---|---|---|---|
| 2003/0197285 | A1* | 10/2003 | Strandberg | H01L 23/3128 |
| | | | | 257/778 |
| 2007/0145571 | A1* | 6/2007 | Lee | H01L 23/04 |
| | | | | 257/706 |
| 2010/0208442 | A1* | 8/2010 | Asano | H05K 1/0271 |
| | | | | 361/783 |
| 2012/0146209 | A1* | 6/2012 | Hu | H01L 23/49833 |
| | | | | 257/692 |
| 2013/0256900 | A1* | 10/2013 | McConnelee | H01L 21/561 |
| | | | | 257/774 |
| 2016/0205778 | A1* | 7/2016 | Lin | H05K 3/4038 |
| | | | | 174/264 |
| 2016/0351549 | A1* | 12/2016 | Lin | H01L 21/50 |
| 2017/0034923 | A1* | 2/2017 | Lin | H05K 3/4647 |
| 2017/0103943 | A1* | 4/2017 | Hu | H01L 23/31 |
| 2017/0372979 | A1* | 12/2017 | Gandhi | H01L 23/562 |
| 2018/0197818 | A1* | 7/2018 | Lin | H01L 23/5389 |
| 2018/0342467 | A1* | 11/2018 | Lim | H01L 24/32 |
| 2019/0006333 | A1* | 1/2019 | Ong | H01L 21/4853 |
| 2019/0181097 | A1* | 6/2019 | Cheah | H01L 25/18 |
| 2020/0006256 | A1* | 1/2020 | Yazzie | H01L 23/562 |

\* cited by examiner

STIFFENER BUILD-UP LAYER PACKAGE

PRIORITY

This application claims the benefit of priority to Malaysia Application Serial No. 2018001203, filed Jun. 28, 2018, which is incorporated by reference herein in its entirety.

FIELD OF THE DISCLOSURE

The present disclosure relates generally to an electrically conductive stiffener that at least partially shields a build-up layer from at least one of electromagnetic interference or radio-frequency interference from one or more electrical components.

BACKGROUND OF THE DISCLOSURE

As technology evolves, circuitry increases in computational power and speed, and decreases in size. As the circuitry involves greater numbers of electrical contacts between components, it can be difficult to maintain a mechanical integrity of the electrical contacts, due to warpage or other mechanical deformities between the components. Further, as the circuitry involves components of increasing computing power and speed placed closer together, it can be difficult to prevent the components from creating electrical interference at the contacts or in other components.

Figure 1:
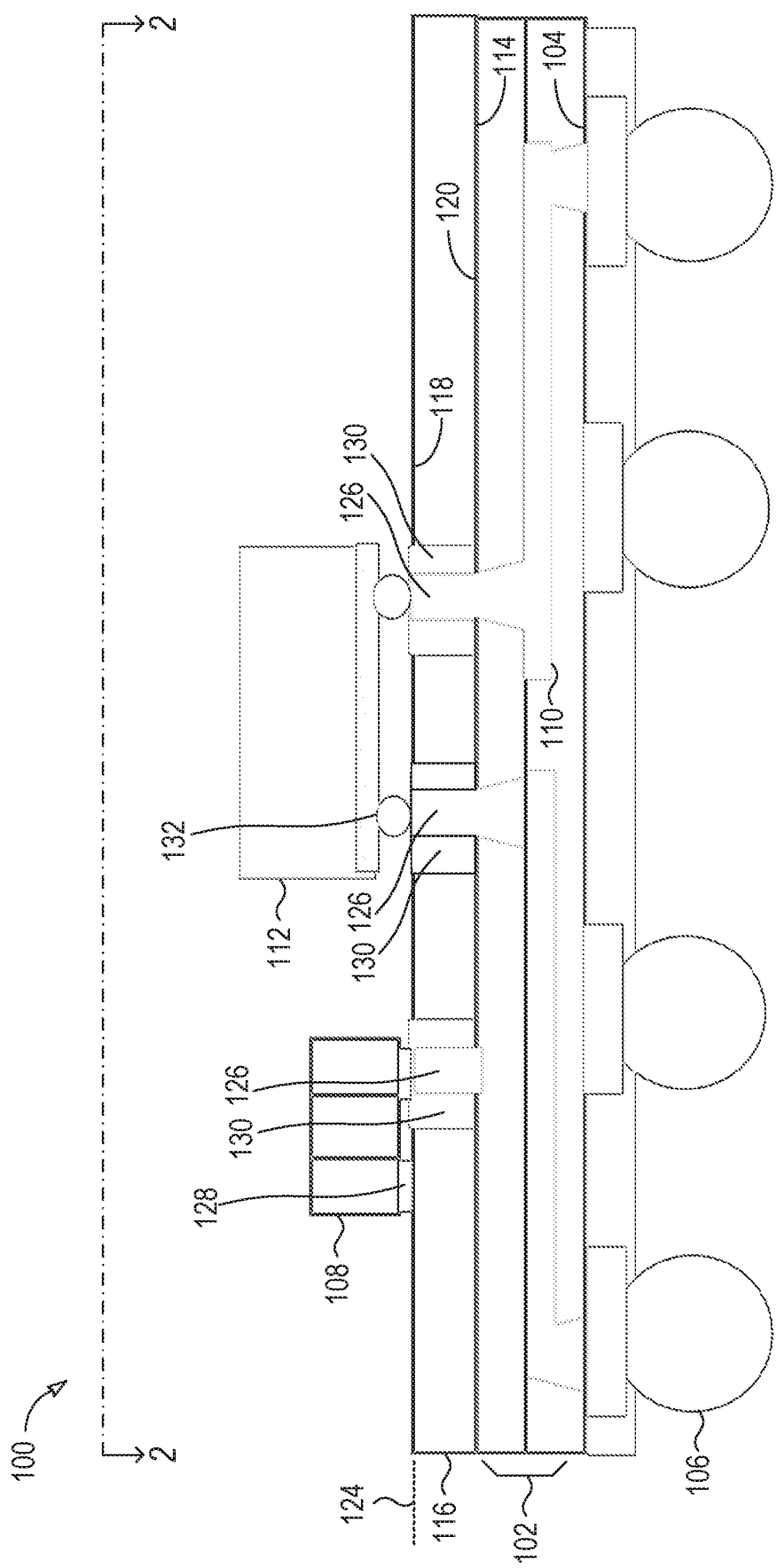
FIG. 1 shows a cross-sectional side view of an example of a chip package that includes an electrically conductive stiffener, in accordance with some examples.

Corresponding reference characters indicate corresponding parts throughout the several views. Elements in the drawings are not necessarily drawn to scale. The configurations shown in the drawings are merely examples, and should not be construed as limiting the scope of the inventive subject matter in any manner.

DETAILED DESCRIPTION

To maintain the integrity of electrical contacts at a build-up layer of a chip package, while reducing electrical interference caused by a chip connected to the build-up layer, the chip package can include a stiffener formed from an electrically conductive material and positioned between the chip and the build-up layer. The chip can electrically connect to the build-up layer through electrical connections that extend through the stiffener. Compared with a stiffener that extends only over a single chip of the chip package, the present stiffener can help prevent warpage or other mechanical deformities that can degrade electrical contacts away from the chip at the build-up layer. Compared with a stiffener that extends only over an area away from the chip, such as a peripheral area, the present stiffener can help reduce electrical interference, such as electromagnetic interference and/or radio-frequency interference, in an area of the build-up layer near the chip, such as a shadow area of the chip.

Such electrical shielding can also help reduce interference between multiple components in the package. Because the electrically conductive stiffener can reduce component-to-component electrical interference, the electrically conductive stiffener can allow components on the package to be positioned closer to one another, thereby reducing a form factor of the package, and consequently potentially reducing a time delay for electrical signals to travel from component to component.

In the figures and the text that follows, the terms "top" and "bottom" are used to show orientations of particular features on particular elements, or relative orientations of one element to another element. The designations of top and bottom are used merely for convenience and clarity, and are not intended to represent absolute orientation or direction. For example, a "top" surface of an element remains a top surface regardless of an absolute orientation of the element, even if the element is inverted during storage or use. This document uses the common convention of a chip package being positioned on top of a motherboard, which establishes directions of up and down, and top and bottom, relative to this convention.

Figure 2:
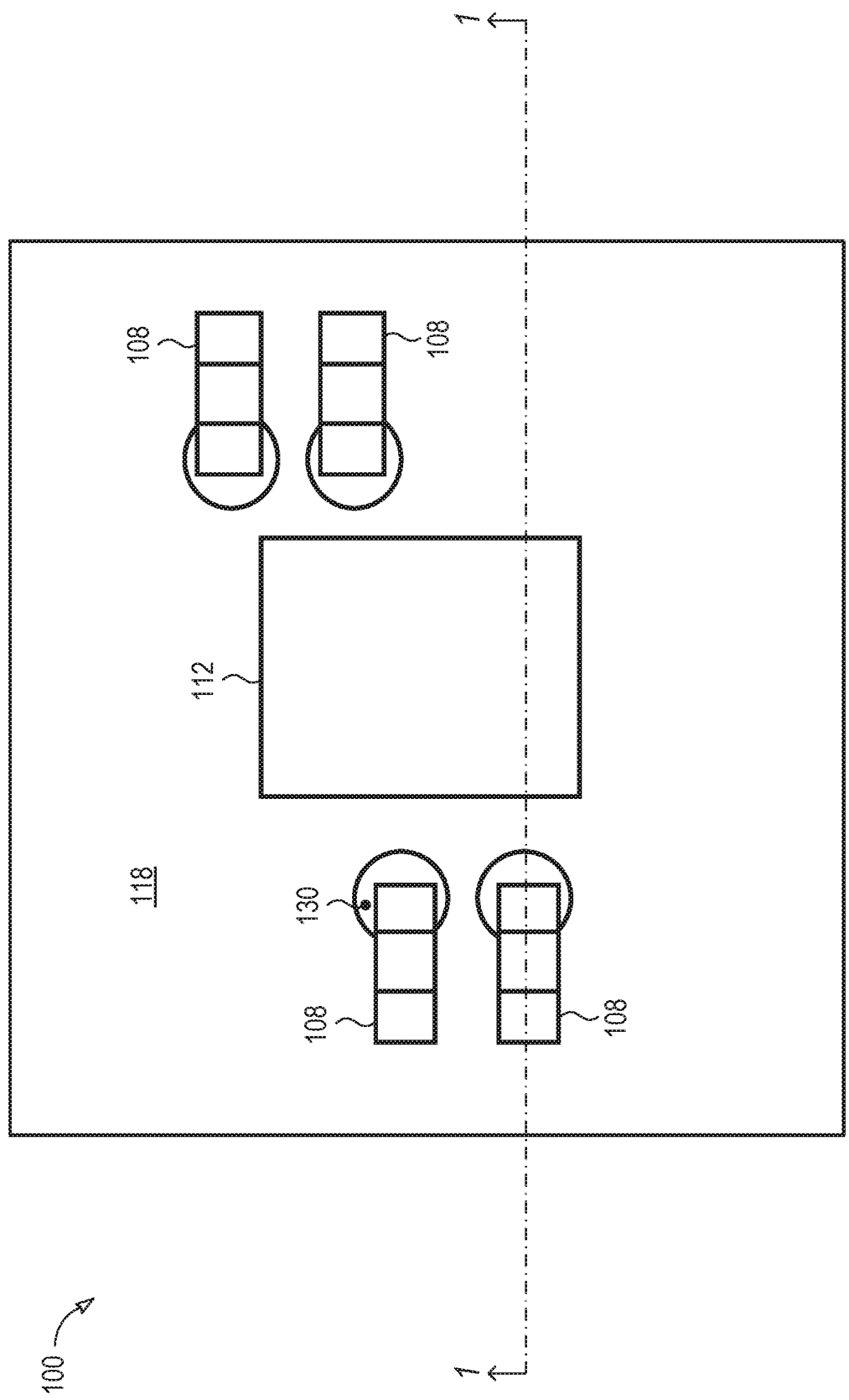
FIG. 2 shows a top view of the chip package of FIG. 1, in accordance with some examples.

FIG. 1 shows a cross-sectional side view of an example of a chip package 100 that includes an electrically conductive stiffener, in accordance with some examples. FIG. 2 shows a top view of the chip package 100 of FIG. 1, in accordance with some examples. The configuration of FIGS. 1 and 2 is but one example of such a chip package; other configurations can also be used.

A build-up layer 102 can have a bottom surface 104 that can electrically connect via solder balls 106 to a printed circuit board, such as a motherboard. The build-up layer 102 can include internal circuitry 110 that can connect the printed circuit board to one or more passive components 108 and one or more active components 112 electrically connected to a top surface 114 of the build-up layer 102. The passive components 108 can include one or more capacitors, resistors, and/or inductors. The active components 112 can include semiconductor memory, such as dynamic random-access memory (DRAM), integrated circuits, such as radio frequency integrated circuits, WWI integrated circuits, processors, chips, or other active components. The active components 112 can also include dies, which can connect to the top surface 114 of the build-up layer 102 through the stiffener, as explained below. In some examples, the active components 112 can optionally include stacked memory 312 (FIG. 3), or other stacked components.

A stiffener 116 can be coupled to the build-up layer 102. In some examples, the stiffener 116 can be formed from a rigid material. In some examples, the build-up layer 102 can extend over a build-up layer area, and the stiffener 116 can extend over a stiffener area matched to or smaller than the build-up layer area.

The stiffener 116 can have a first side 118 and a second side 120 opposite the first side 118. In some examples, the first side 118 can be generally flat, optionally with one or more recesses that extend into the stiffener 116 (see FIG. 3), and various electrical connection locations positioned on the first side 118 or in the recesses. In some examples, the second side 120 can also be generally flat, with various electrical connection locations positioned over the second side 120. In some examples, the second side 120 of the stiffener 116 can be planar, and the first side 118 of the stiffener 116, away from any recesses, can define a plane 124 that is parallel to the second side 120.

In some examples, the stiffener 116 can be electrically coupled to a reference voltage source, such as a ground (Vss) reference voltage, which resides within the components 112 and/or a motherboard (not shown) through the internal circuitry 110 of the build-up layer 102. Setting the stiffener 116 to a reference voltage can provide additional electrical shielding in the chip package 100.

The stiffener 116 can include a respective plurality of electrical connections 126 that extend through the stiffener 116 to the second side 120 of the stiffener 116. In some examples, each electrical connection 126, such as for signal input/output (I/O) or power routing, can be insulated or electrically isolated from the stiffener 116 by a dielectric layer 130. In some examples, the electrical connection 126, such as for signal input/output (I/O) or power routing, can include electrically conducting material shaped into a vertically-extending member that is laterally (e.g., horizontally) surrounded by a dielectric (e.g., non-conductive) material.

In some examples, at least one electrical connection 128, such as a solder connection, can lack the surrounding dielectric material, and can be in direct contact with the stiffener 116, so that the electrical connection 128 can be electrically connected to a reference voltage, such as a ground (Vss) reference voltage. In some examples, one or more passive components 108 can include one electrical connection 126 to a power supply rail, such as a power (Vcc) plane or network, through the internal circuitry 110 in the build-up layer 102. Setting the stiffener 116 to a reference voltage, such as a ground (Vss) reference voltage, can provide additional electrical shielding in the chip package 100.

In some examples, the components 112 can have a plurality of electrical connections 132 that are spaced apart, center-to-center, by a first value, and the vertical interconnects 126 can be spaced apart, center-to-center, by the first value. In other examples, manufacturing constraints may not be able to space the vertical interconnects 126 as closely as the electrical connections of the components 112. For these examples, the components 112 can have electrical connections that are spaced apart, center-to-center, by a first value, and the vertical interconnects 126 can be spaced apart, center-to-center, by a second value greater than the first value.

In some examples, such as the configuration shown in FIGS. 1 and 2, the vertically-extending member can have a cross-section, taken in a plane parallel to the first side 118 or the second side 120 of the stiffener 116, that remains constant from the top of the vertically-extending member, at the first side 118 of the stiffener 116, to the bottom of the vertically-extending member, at the second side 120 of the stiffener 116. There can be alternate configurations for the vertically-extending member, in which the vertically-extending member can have a cross-section, taken in a plane parallel to the first or second sides of the stiffener, that varies from the first side of the stiffener to the second side of the stiffener. For example, the cross-section can increase in size from the first side of the stiffener to the second side of the stiffener. The increase can be continuous, stepwise, or a combination of continuous and one or more discrete steps. Such a variation in cross-sectional size of the vertically-extending member can match a cross-sectional size of the vertically-extending member to a corresponding connector on a component (e.g., at the first side of the stiffener) or to a corresponding connector on the package substrate (e.g., at the second side of the stiffener). Matching the cross-sectional size in this manner can improve a robustness of the electrical connections, and can help ease manufacturing and/or placement tolerances. In some examples, all of the vertical interconnects vary in cross-sectional size from the first side of the stiffener to the second side of the stiffener. In other examples, at least one of the vertical interconnects varies in cross-sectional size from the first side of the stiffener to the second side of the stiffener. For example, use of a variable cross-sectional size can vary from location to location across an area of the stiffener. In still other examples, because such a variation in size is optional, none of the vertical interconnects may vary in cross-sectional size from the first side of the stiffener to the second side of the stiffener.

The stiffener 116 can be formed from an electrically conductive material that at least partially electrically shields the build-up layer 102 from electromagnetic interference or radio-frequency interference produced by an active component 112. In some examples, the electrically conductive material can be a conductive metal, such as copper, aluminum, stainless steel, or another suitable metal. When there are components 112, such as dies, present in recesses in the stiffener, the stiffener 116 can at least partially electrically shield the components 112 from one another. In some examples, the stiffener 116 can be formed as a metal sheet, optionally having a thickness between 0.015 mm (15 microns) and 0.2 mm (200 microns). Other thicknesses and thickness ranges can also be used.

Figure 3:
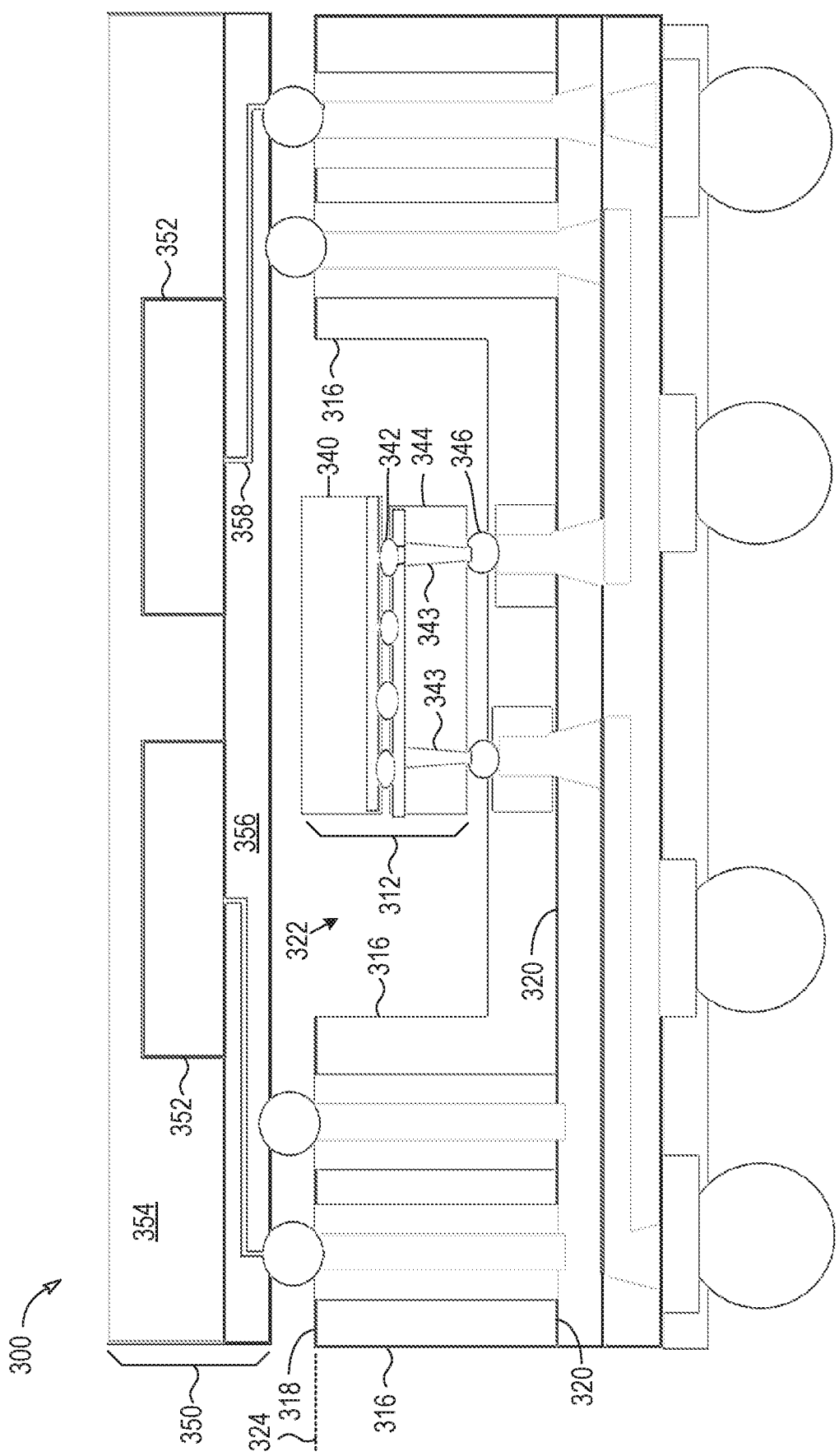
FIG. 3 shows a cross-sectional side view of another example of a chip package that includes an electrically conductive stiffener, in accordance with some examples.
Figure 4:
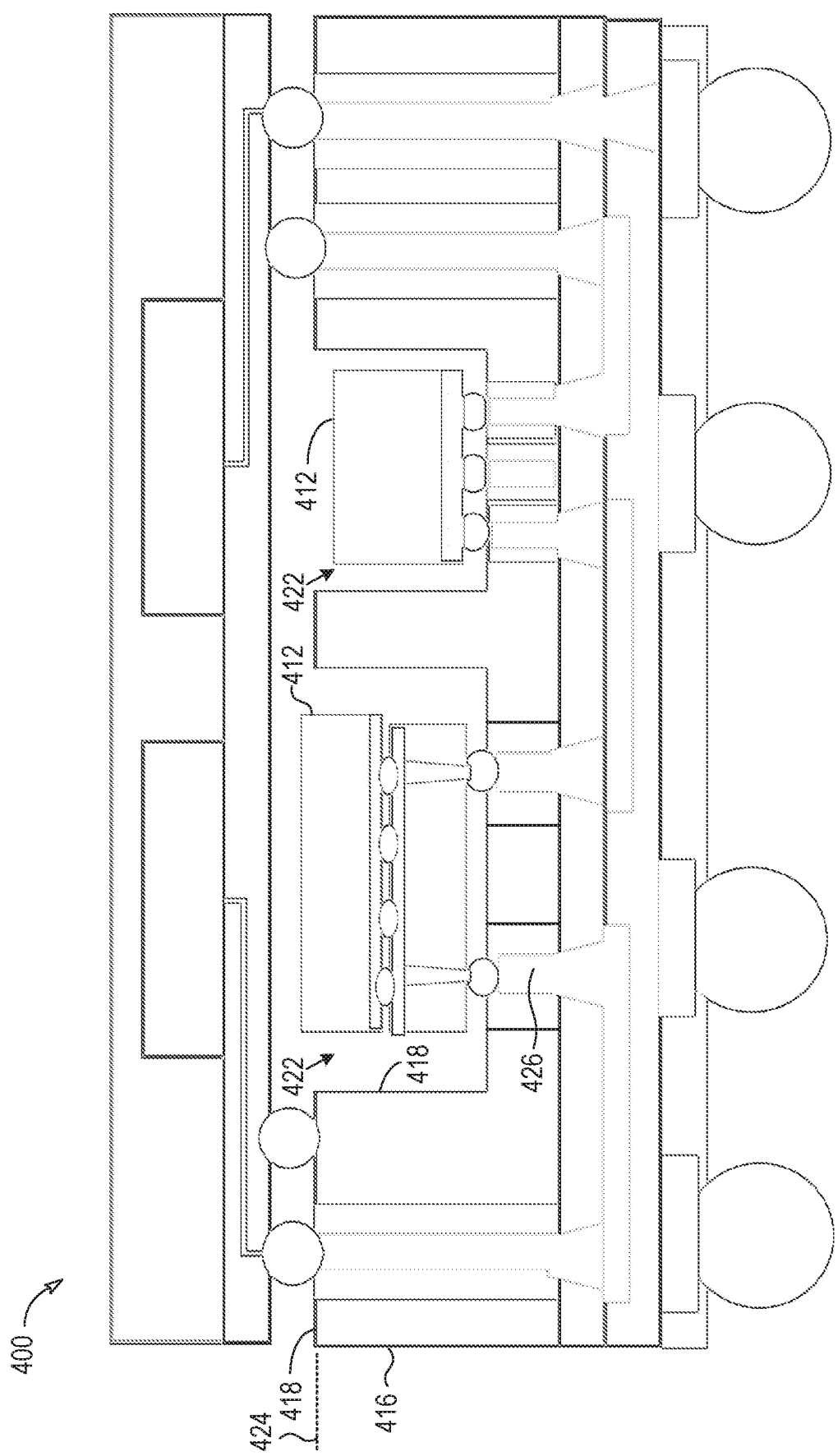
FIG. 4 shows a cross-sectional side view of another example of a chip package that includes an electrically conductive stiffener, in accordance with some examples.

As an alternative to the configuration of FIGS. 1 and 2, FIG. 3 shows a cross-sectional side view of another example of a chip package 300 that includes an electrically conductive stiffener 316, in accordance with some examples. The configuration of 3 is but another example of such a chip package, other configurations can also be used.

Many elements of the chip package 300 are the same as for chip package 100 of FIGS. 1 and 2. For these elements in common, the element numbers are omitted in FIG. 3, for clarity. There are three differences between the chip package 300 and the chip package 100 of FIGS. 1 and 2, as detailed below. Each of these three differences can he used independently of the other two, or mix-and-matched in any suitable combination.

A first difference pertains to the shape of the stiffener. In the configuration of FIGS. 1 and 2, the first side 118 of the stiffener 116 is planar. In contrast, in the configuration of FIG. 3 the stiffener 316 can include one or more recesses 322 on the first side 318. In some examples, the recesses 322 can extend only partially into the stiffener 316, and not extend fully through the stiffener 316. In some examples, the recesses 322 can have a same depth, so that the stiffener 316 has a reduced thickness in the recess areas, and a nominal thickness away from the recesses 322. Additional depths can also be used. In some of these examples, the reduced and nominal thicknesses can differ by an amount greater than a height (e.g., a z-height, or a vertical height) of at least one of the components 312, so that when the components 312 are positioned in the recesses, the at least one component 312 does not extend beyond the plane 324 defined by the first side 318 of the stiffener 316. In some examples, more than one component 312 can be positioned in the recess 322.

Each recess 322 can extend over a respective recess area on the first side. In some examples, the recess areas can be sized and shaped to accommodate the sizes and shapes of respective dies. For example, for a generally planar die that has a particular length and a particular width, the corresponding recess can have a slightly larger length than the particular length and a slightly larger width than the particular width, so that when the die is inserted into the recess, the die can have a clearance around its perimeter that can account for tooling clearances and typical manufacturing and alignment tolerances.

In some examples, each recess 322 can define a respective recess volume that extends into the first side 318 of the stiffener 316. In some examples, the recess volume can include generally orthogonal walls, which can be formed by stamping, drilling, trenching, or one or more other suitable manufacturing techniques that can produce vertical walls on a generally horizontal or layered structure. For these examples, the recess area can remain constant from the first side 318 of the stiffener 316 to the second side 320 of the stiffener 316. In other examples, the recess volume can include one or more tapered walls, which can taper inward at increasing depths into the stiffener 316, so that the recess area at the bottom of the recess 322 can be smaller than the recess area at the top of the recess 322 (e.g., at the plane 324 defined by the first side 318 of the stiffener 316).

A second difference pertains to the component 312. In the configuration of FIGS. 1 and 2, each active component 112 can be a die, or other suitable component having a single layer of connectors that face the stiffener. In contrast, in the configuration of FIG. 3, the component 312 can be a stacked component, such as a stacked logic component which can include a central processing unit (CPU) and a platform controller hub (PCH) or chipset. The component 312 can include a first layer 340, such as a silicon die with a plurality of transistor devices and metal interconnects, having a first set of electrical connectors 342, such as electrical bumps. The first set of electrical connectors 342 can connect to a second layer 344 through a plurality of through silicon via (TSV) interconnects 343. The second layer 344 can having a second set of electrical connectors 346, which connect to the stiffener 316. In one example, the first layer 340 can be a CPU and the second layer 344 can be a PCH or chipset. In one example, the first layer 340 and the second layer 344 are arranged such that the respective active layers are adjacent to the first set of electrical connectors 342 for reduced communication latency. Alternatively, there can be more than two layers, with more than two corresponding sets of electrical connectors. In some examples, all the components are stacked. In other examples, only one or more of the components are stacked. In still other examples, because stacking is optional, none of the components may be stacked.

A third difference pertains to additional elements coupled to the first side 318 of the stiffener 316. In some examples, a top package 350 can electrically couple to the first side 318 of the stiffener 316. In some examples, the top package 350 can include one or more chips 352, such as memory chips. In some examples, the one or more chips 352 can be packaged in a molded material 354. In some examples, electrical connections to and from the one or more chips 352 can be routed through a redistribution layer 356, which includes internal circuitry 358 that can reposition the electrical connections to align with corresponding electrical connections on the first side 318 of the stiffener 316. The distribution layer 356 can be positioned against the molded material 354.

As an alternative to the configurations of FIGS. 1-3 and 2, FIG. 4 shows a cross-sectional side view of another example of a chip package 400 that includes an electrically conductive stiffener, in accordance with some examples. Many elements of the chip package 400 are the same as for chip package 300 of FIG. 3. For these elements in common, the element numbers are omitted in FIG. 4, for clarity.

In the configuration of FIG. 3, the stiffener 316 includes a single recess 322 extends into the first side 318 of the stiffener 316. In contrast, in the configuration of FIG. 4, the stiffener 416 can include multiple recesses 422 extending into the first side 418 of the stiffener 416. In some examples, each recess 422 can optionally include one or more active components 412 positioned in the recess 422. In some examples, the components 412 can include a post-assembled integrated circuit (I/C) die with a package substrate and a plurality of solder balls. Each active component 412 can electrically couple to the build-up layer through electrical connections 426 at a bottom of a respective recess 422. In some examples, the stiffener 416 can be electrically coupled to a reference voltage, such as a ground (Vss) reference voltage, through the internal circuitry of the build-up layer 402. In some examples, electromagnetic interference and/or radio-frequency interference between components 412 in respective recesses 422 can be shielded by the orthogonal wall of the stiffener 416 in between the recesses 422. In some examples, when the components 412 are positioned in the recess 422, at least one component 412 may optionally not extend beyond the plane 424 defined by the first side 418 of the stiffener 416.

FIGS. 5-14 show an assembly process for the chip package 100, 300, or 400, as various components of the chip package are formed and attached to one another, in accordance with some examples.

Figure 5:
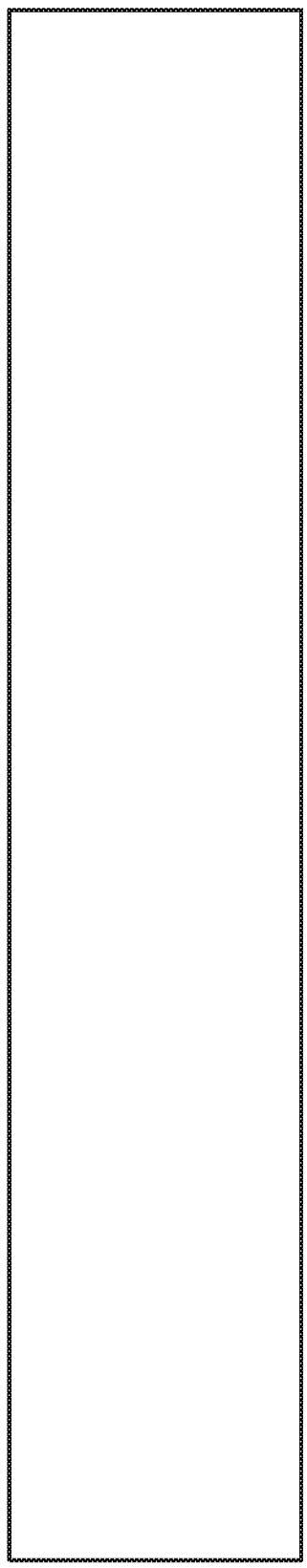
FIGS. 5-14 show an assembly process for a chip package, as various components of the chip package are formed and attached to one another, in accordance with some examples.

FIG. 5 shows a portion of a body 500 of stiffener material, such as stainless steel, copper, aluminum, or other conductive metal, in accordance with some examples. The body 500 can initially be rectangular in shape, and can lack the optional recesses that can appear in the finished stiffener. In some examples, the thickness of the stiffener body 500 of can be between 0.015 mm and 0.5 mm, inclusively; between 0.2 mm and 0.3 mm, inclusively, or in another suitable range.

Figure 6:
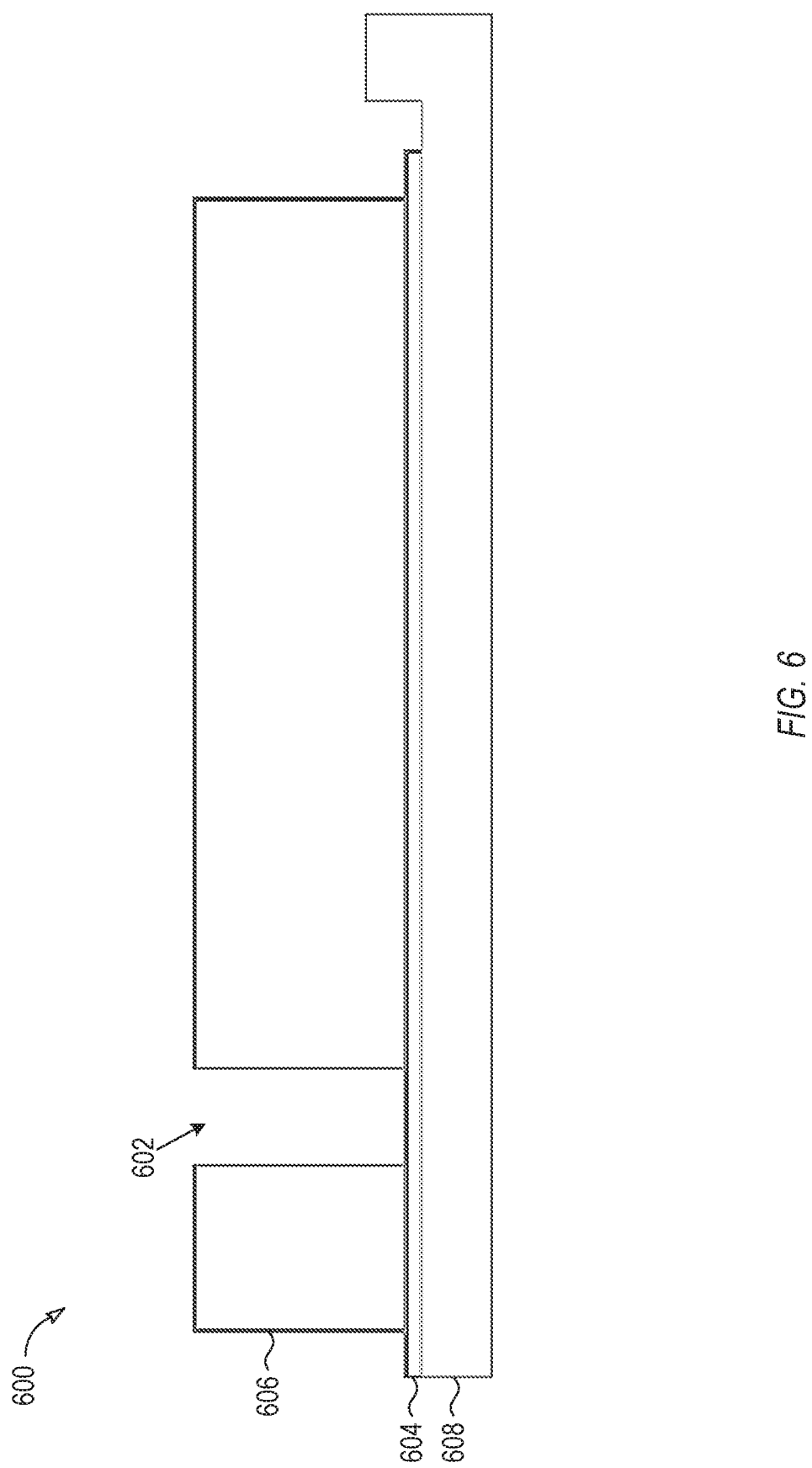

FIG. 6 shows a portion of a device under assembly 600, after a mechanical drilling process and/or a laser drilling process has formed a first hole 602 through the body 500 of FIG. 5, in accordance with some examples. A release film 604 has been attached to a bottom side of the drilled body 606, so that the first hole 602 extends to the release film 604. A stiffener build-up layer carrier 608 has been attached to a bottom side of the release film 604. Although only one first hole is shown in FIGS. 6-7, several first holes can be present.

Figure 7:
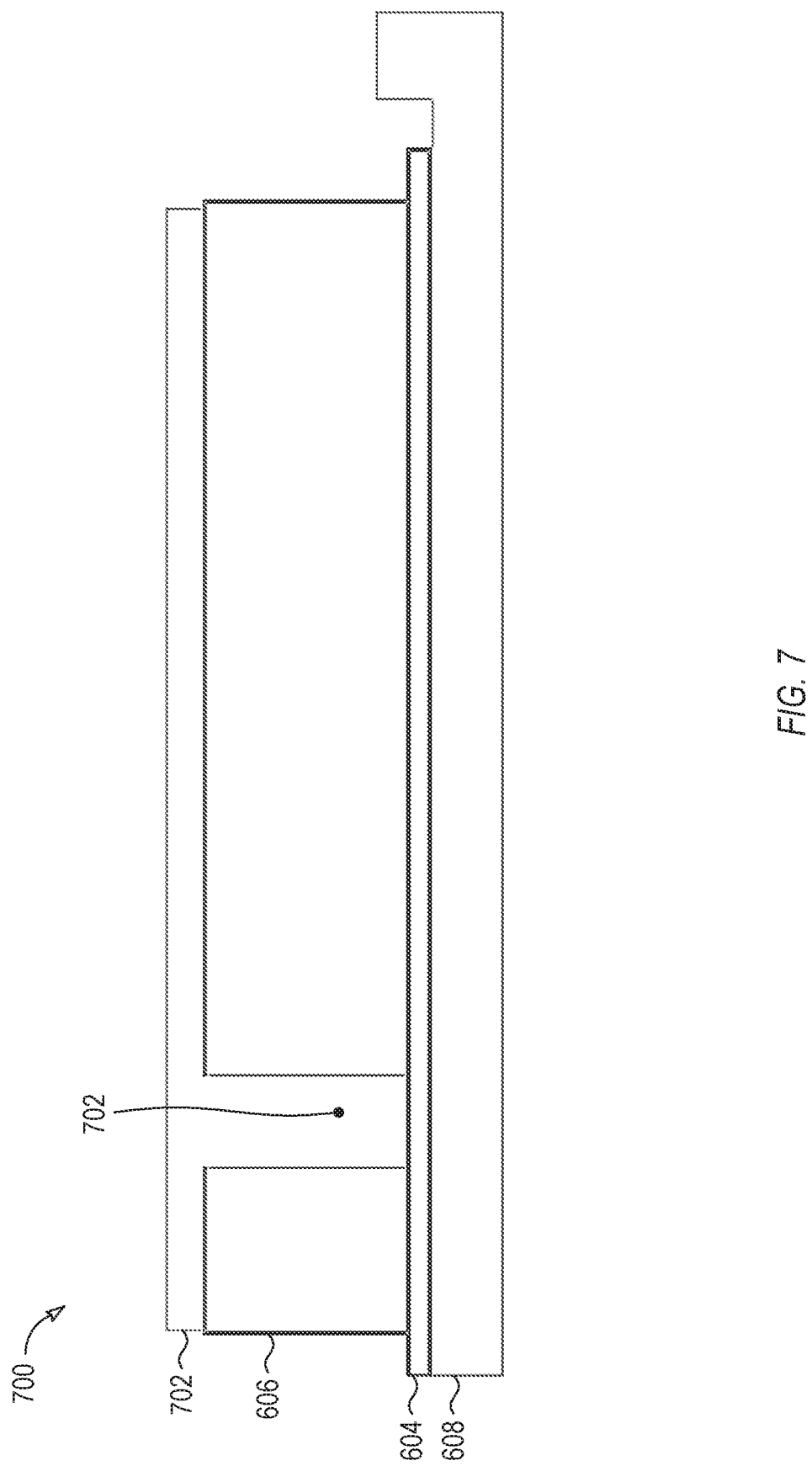

FIG. 7 shows a portion of a device under assembly 700, after a printing, dispensing, and or plugging process has filled the first hole 602 with a dielectric material 702, and the dielectric material 702 has been deposited on top of the body 606, in accordance with some examples.

Figure 8:
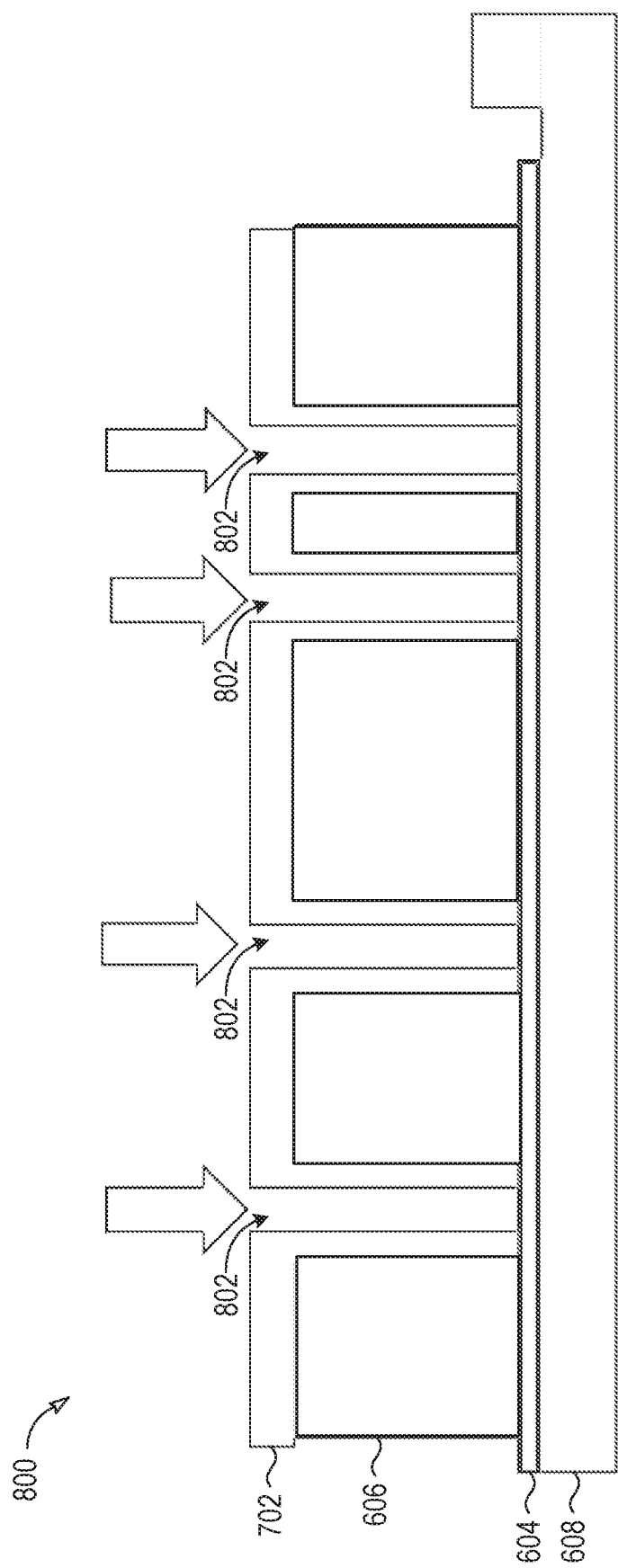

FIG. 8 shows a portion of a device under assembly 800, after second holes 802 have been drilled through the dielectric material 702, in accordance with some examples. In some examples, where a first hole 602 corresponds to more than one vertical interconnect, there can be more than one second hole 802 corresponding to the first hole 602. In some examples, the second holes 802 can be formed through an etching processes, such as a laser etching, rather than a mechanical drill, which can impart great precision to the locations of the second holes 802. The precisely-located second holes 802 can determine the locations of electrical connectors on the attached components. Note that the first holes 602 need not be formed as precisely as the second holes 802, because any positional errors in the first holes 602 may change the edges of the regions filled with dielectric material 702, but would not create any downstream misalignments between corresponding electrical connectors. In other examples, the second holes 802 can be mechanically drilled or laser drilled.

Figure 9:
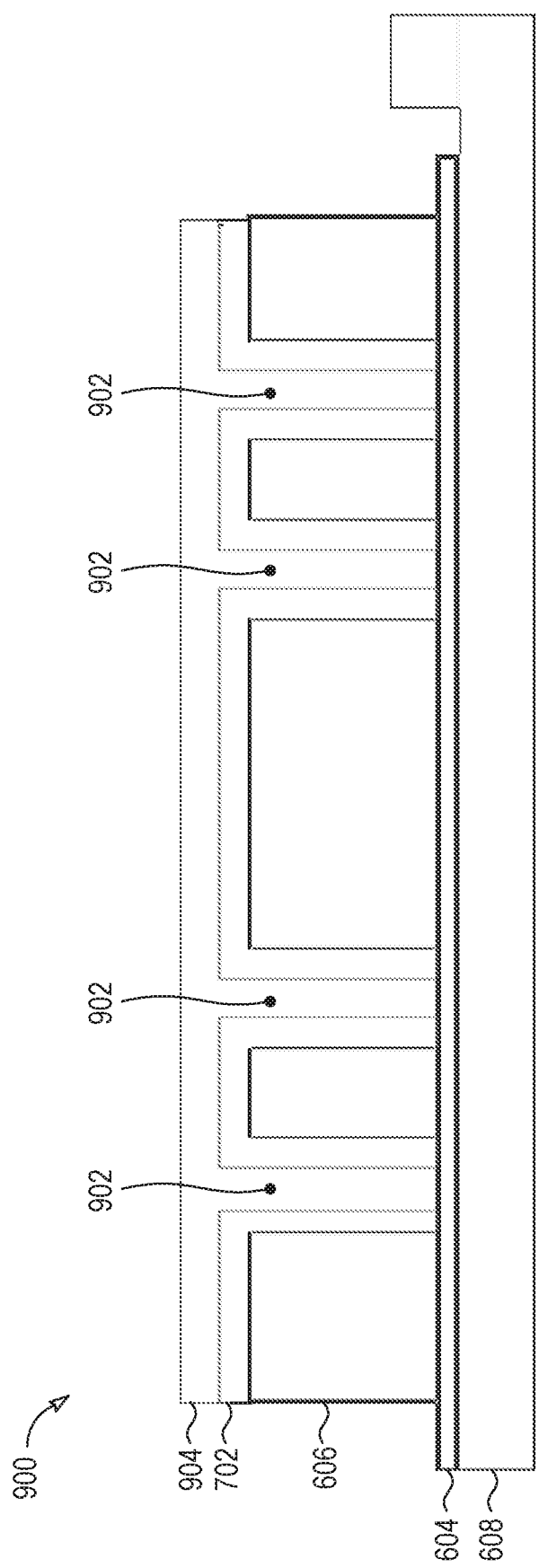

FIG. 9 shows a portion of a device under assembly 900, after second second holes 802 have been filled with an electrically conductive material 902, and an electroless/electrolytic plating process has applied a layer 904 of the electrically conductive material 902 to a top of the dielectric material 702, in accordance with some examples. The electrically conductive material 902 forms the vertical interconnects in the finished stiffener. Note that two or more vertical interconnects can be separated by just dielectric material 702, for closely-spaced connectors on the components.

Figure 10:
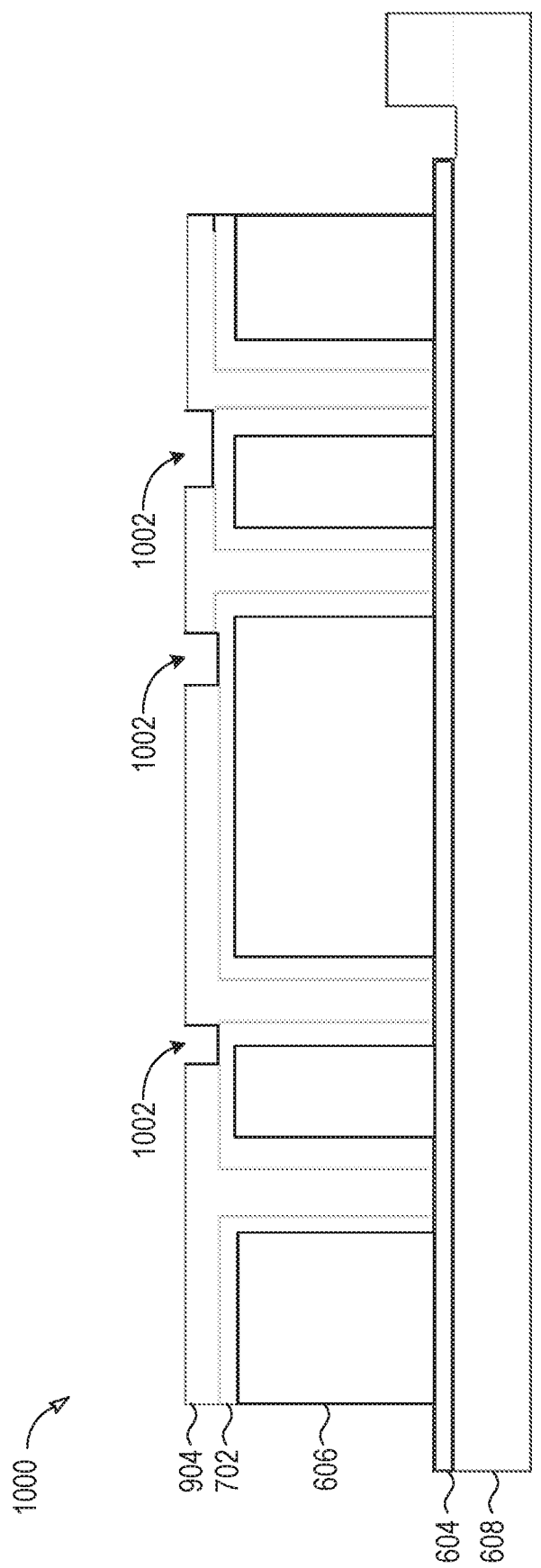

FIG. 10 shows a portion of a device under assembly 1000, after portions 1002 have been etched in the layer 904 of electrically conductive material, in accordance with some examples. The portions 1002 can be etched using photolithography patterning (to ensure precise dimensions and spacings), and dry film resist (DFR) lamination/development/etching.

Figure 11:
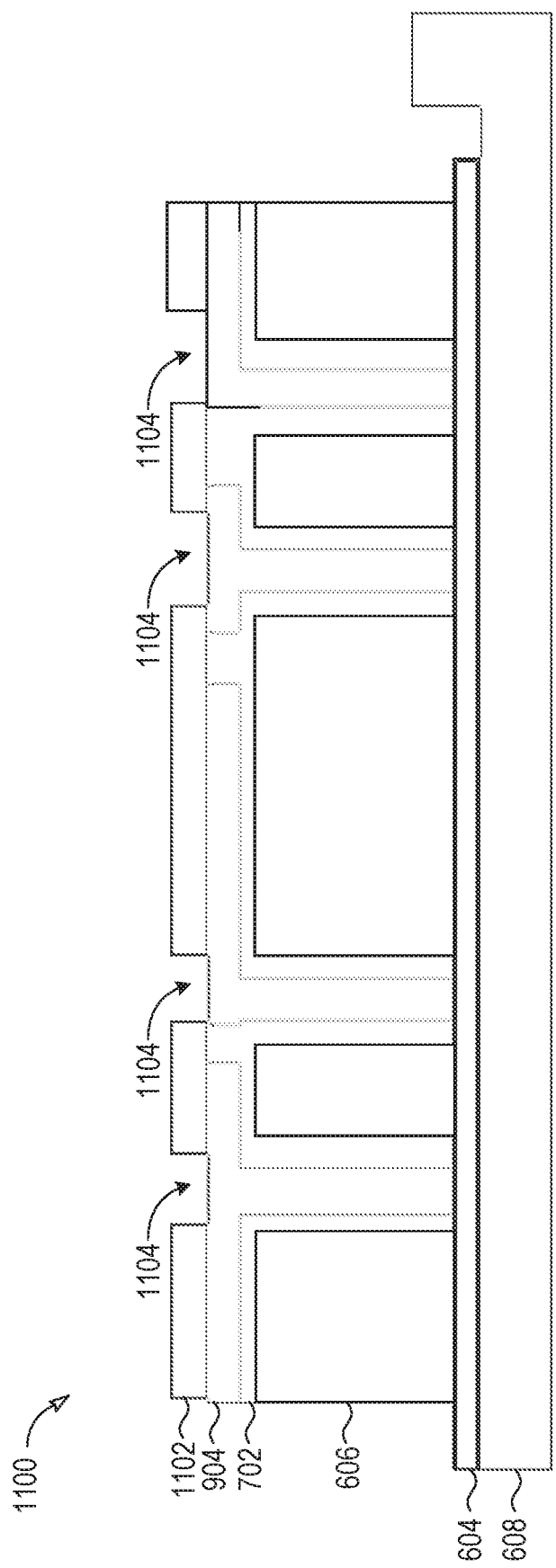

FIG. 11 shows a portion of a device under assembly 1100, after a layer 1102 of solder resist has been applied over the layer 904 of electrically conductive material, in accordance with some examples. The layer 1102 can include openings 1104 that extend to the electrically conductive material coupled to the vertical interconnects. The openings 1104 can be etched using photolithography patterning (to ensure precise dimensions and spacings), and DFR lamination/development/etching.

Figure 12:
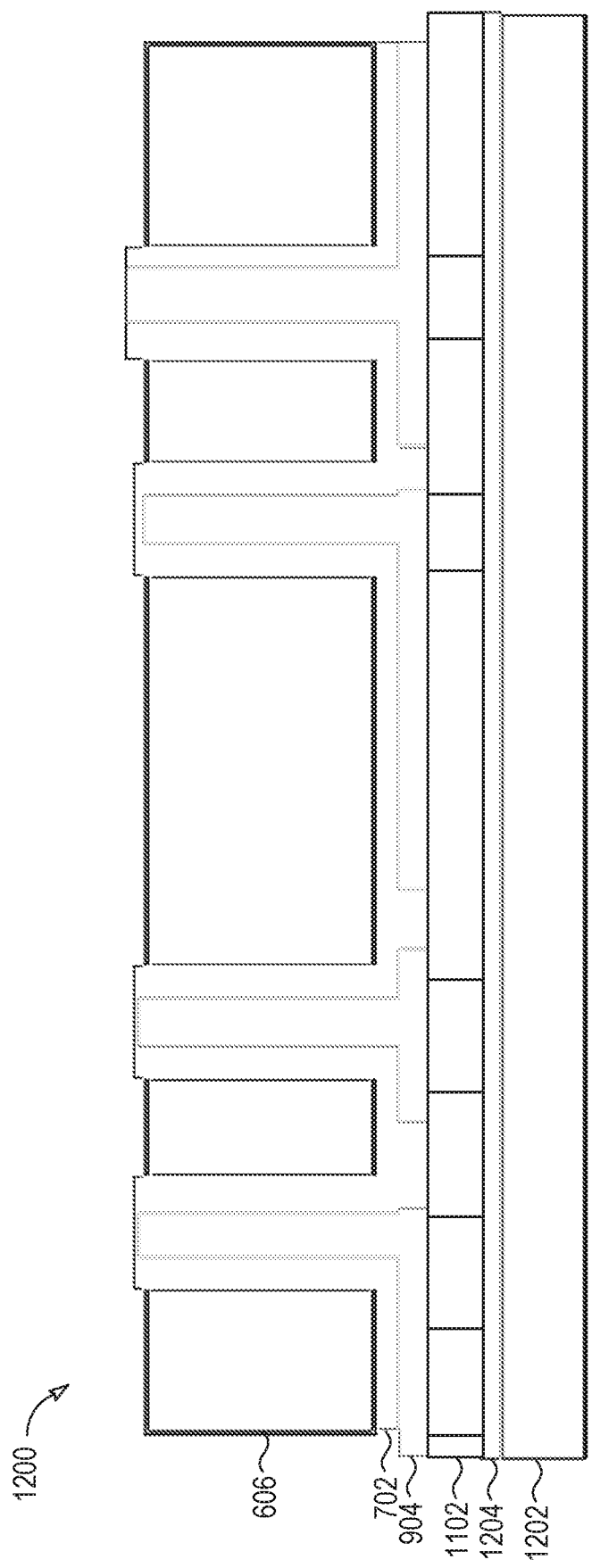

FIG. 12 shows a portion of a device under assembly 1200, now inverted in the drawings. In FIG. 12, the release film 604 and the stiffener build-up layer carrier 608 have been removed, and a second carrier 1202, together with a second release film 1204, have been attached to a bottom of the inverted device.

Figure 13:
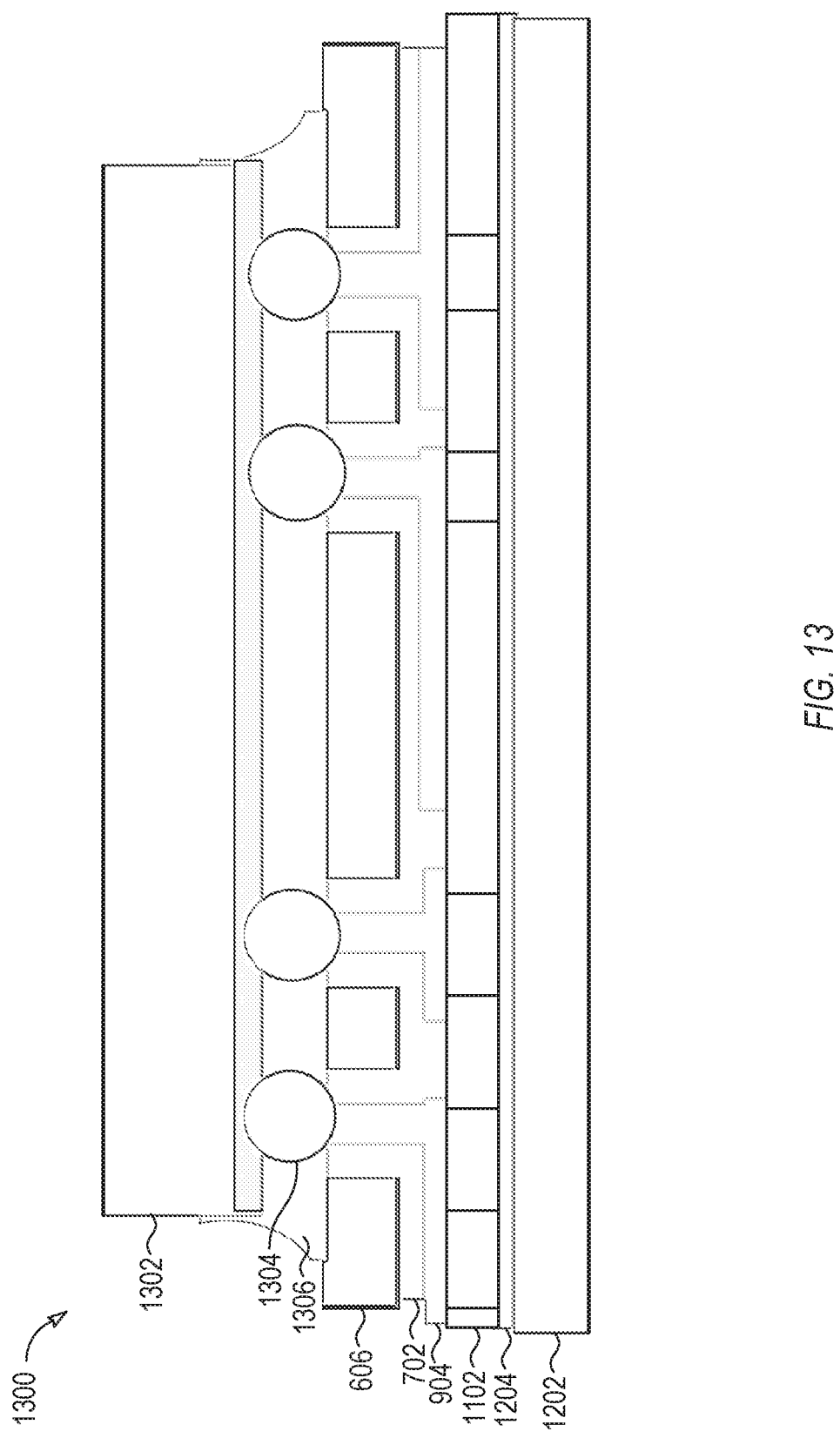

FIG. 13 shows a portion of a device under assembly 1300, after the body 606 has been reduced in height, such as by a grinding process, and a die 1302 has been attached via solder bumps 1304 to corresponding electrical connections in the body 606, in accordance with some examples. The attachment can use surface mounting, solder reflow, and a dispensing process to surround the solder bumps 1304 with an underfill layer 1306.

Figure 14:
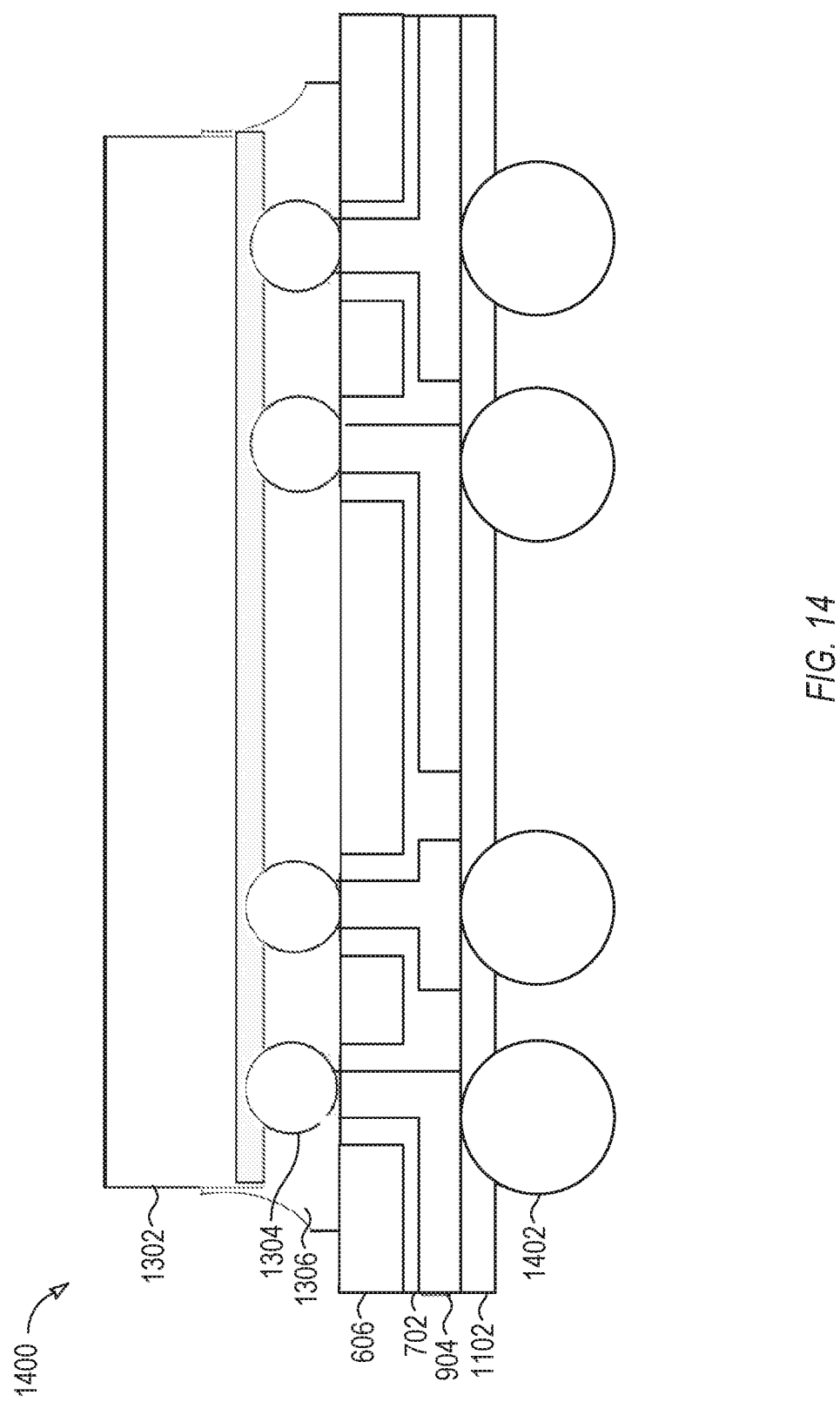

FIG. 14 shows a portion of a device under assembly 1400, after the second carrier 1202 and the second release film 1204 have been removed, and after solder balls 1402 have been attached to the electrical conductive material of the layer 904 through the layer 1102 of solder resist, in accordance with some examples.

The assembly process shown FIGS. 5-14 is but one example of an assembly process that can produce the chip package 100, 300, or 400. Other suitable assembly processes can also be used.

Figure 15:
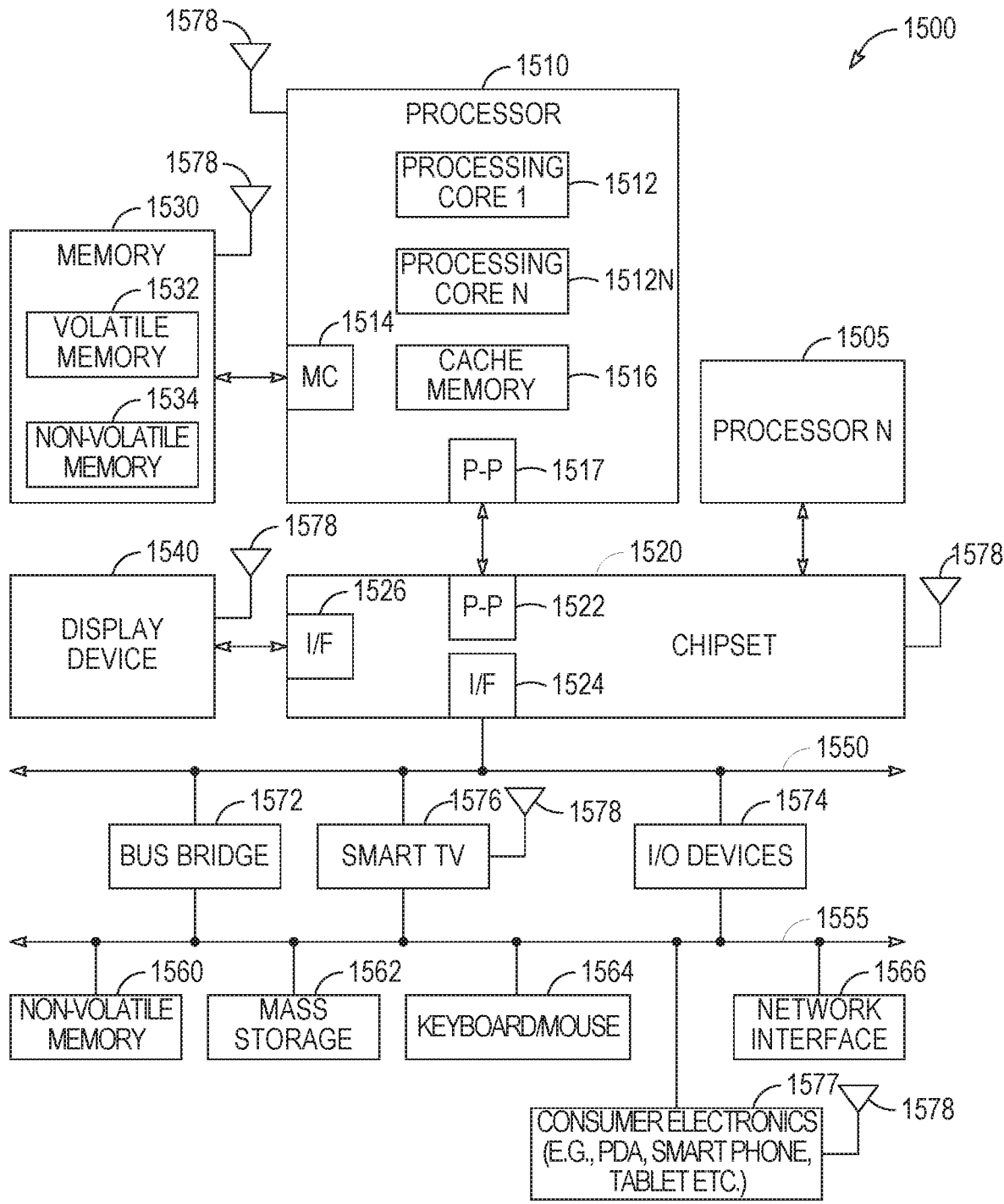
FIG. 15 illustrates a system level diagram, depicting an example of an electronic device (e.g., system) including the stiffener and system as described in the present disclosure.

FIG. 15 illustrates a system level diagram, depicting an example of an electronic device (e.g., system) including the stiffener and system as described in the present disclosure. FIG. 15 is included to show an example of a higher-level device application for the stiffener and system. In one embodiment, system 1500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1500 is a system on a chip (SOC) system.

In one embodiment, processor 1510 has one or more processor cores 1512 and 1512N, where 1512N represents the Nth processor core inside processor 1510 where N is a positive integer. In one embodiment, system 1500 includes multiple processors including 1510 and 1505, where processor 1505 has logic similar or identical to the logic of processor 1510. In some embodiments, processing core 1512 includes, but is not limited to, pre-fetch logic to fetch instructions, decode logic to decode the instructions, execution logic to execute instructions and the like. In some embodiments, processor 1510 has a cache memory 1516 to cache instructions and/or data for system 1500. Cache memory 1516 may be organized into a hierarchal structure including one or more levels of cache memory.

In some embodiments, processor 1510 includes a memory controller 1514, which is operable to perform functions that enable the processor 1510 to access and communicate with memory 1530 that includes a volatile memory 1532 and/or a non-volatile memory 1534. In some embodiments, processor 1510 is coupled with memory 1530 and chipset 1520. Processor 1510 may also be coupled to a wireless antenna 1578 to communicate with any device configured to transmit and/or receive wireless signals. In one embodiment, an interface for wireless antenna 1578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1532 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. Non-volatile memory 1534 includes, but is not limited to, flash memory, phase change memory (PCM), read-only memory (ROM), electrically erasable programmable read-only memory (EEPROM), or any other type of non-volatile memory device.

Memory 1530 stores information and instructions to be executed by processor 1510. In one embodiment, memory 1530 may also store temporary variables or other intermediate information while processor 1510 is executing instructions. In the illustrated embodiment, chipset 1520 connects with processor 1510 via Point-to-Point (PtP or P-P) interfaces 1517 and 1522. Chipset 1520 enables processor 1510 to connect to other elements in system 1500. In some embodiments of the example system, interfaces 1517 and 1522 operate in accordance with a PtP communication protocol such as the Intel® QuickPath Interconnect (QPI) or the like. In other embodiments, a different interconnect may be used.

In some embodiments, chipset 1520 is operable to communicate with processor 1510, 1505N, display device 1540, and other devices, including a bus bridge 1572, a smart TV 1576, I/O devices 1574, nonvolatile memory 1560, a storage medium (such as one or more mass storage devices) 1562, a keyboard/mouse 1564, a network interface 1566, and various forms of consumer electronics 1577 (such as a PDA, smart phone, tablet etc.), etc. In one embodiment, chipset 1520 couples with these devices through an interface 1524.

Chipset 1520 may also be coupled to a wireless antenna 1578 to communicate with any device configured to transmit and/or receive wireless signals.

Chipset 1520 connects to display device 1540 via interface 1526. Display 1540 may be, for example, a liquid crystal display (LCD), a light emitting diode (LED) array, an organic light emitting diode (OLED) array, or any other form of visual display device. In some embodiments of the example system, processor 1510 and chipset 1520 are merged into a single SOC. In addition, chipset 1520 connects to one or more buses 1550 and 1555 that interconnect various system elements, such as I/O devices 1574, non-volatile memory 1560, storage medium 1562, a keyboard/mouse 1564, and network interface 1566. Buses 1550 and 1555 may be interconnected together via a bus bridge 1572.

In one embodiment, mass storage device 1562 includes, but is not limited to, a solid-state drive, a hard disk drive, a universal serial bus flash memory drive, or any other form of computer data storage medium. In one embodiment, network interface 1566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 15 are depicted as separate blocks within the system 1500, the functions performed by some of these blocks may be integrated within a single semiconductor circuit or may be implemented using two or more separate integrated circuits. For example, although cache memory 1516 is depicted as a separate block within processor 1510, cache memory 1516 (or selected aspects of 1516) can be incorporated into processor core 1512.

Figure 16:
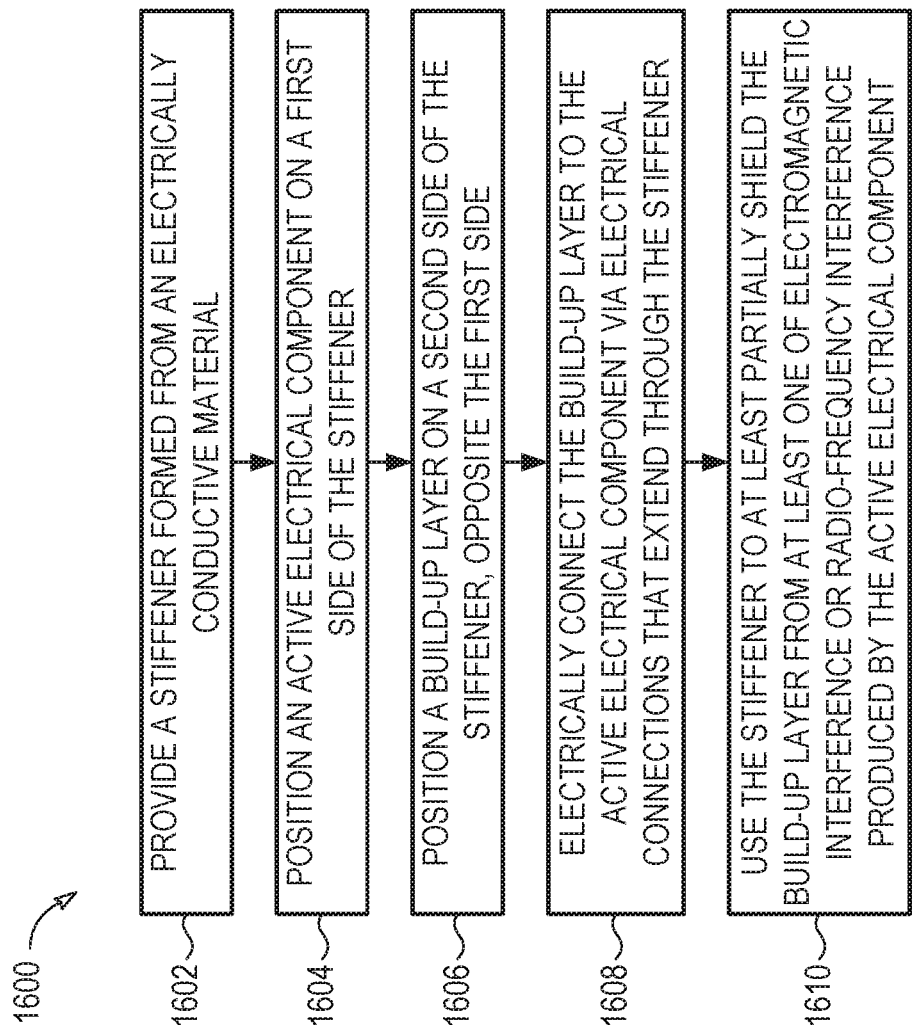
FIG. 16 shows a flowchart of an example of a method for implementing an electrically conductive stiffener that at least partially electrically shields one element from another, in accordance with some examples.

FIG. 16 shows a flowchart of an example of a method 1600 for implementing an electrically conductive stiffener that at least partially electrically shields one element from another, in accordance with some examples. The method 1600 is suitable for implementing the stiffeners 100, 300, or 400, shown in FIGS. 1-4, and for other suitable stiffeners. The method 1600 is but one suitable method; other suitable methods can also be used.

At operation 1602, a stiffener formed from an electrically conductive material can be provided.

At operation 1604, an active electrical component can be positioned on a first side of the stiffener.

At operation 1606, a build-up layer can be positioned on a second side of the stiffener, opposite the first side.

At operation 1608, the build-up layer can be electrically connected to the active electrical component via electrical connections that extend through the stiffener.

At operation 1610, the stiffener can be used to at least partially shield the build-up layer from at least one of electromagnetic interference or radio-frequency interference produced by the active electrical component.

In some examples, providing the stiffener can optionally further include: providing a body formed from an electrically conductive material; drilling a plurality of first holes through the body; filling the first holes with a dielectric material; forming a plurality of second holes through the dielectric material, the second holes being formed from an etching process, the second holes being positioned to determine locations of the electrical connections that extend through the stiffener; and filling the second holes with an electrically conductive material to form the electrical connections that extend through the stiffener.

In the foregoing detailed description, the method and apparatus of the present disclosure have been described with reference to specific embodiments thereof. It will, however, be evident that various modifications and changes may be made thereto without departing from the broader spirit and scope of the present disclosure. The present specification and figures are accordingly to be regarded as illustrative rather than restrictive.

To further illustrate the device and related method disclosed herein, a non-limiting list of examples is provided below. Each of the following non-limiting examples can stand on its own, or can be combined in any permutation or combination with any one or more of the other examples.

In Example 1, a chip package can include: a stiffener having a first side and a second side opposite the first side; a first electrical component positioned on the first side of the stiffener; and a build-up layer positioned on the second side of the stiffener and electrically connected to the first electrical component through the stiffener; wherein the stiffener is formed from an electrically conductive material that at least partially shields the build-up layer from at least one of electromagnetic interference or radio-frequency interference from the first electrical component.

In Example 2, the chip package of Example 1 can optionally be configured such that the first electrical component is electrically connected to the build-up layer via a plurality of electrical connections that extend through the stiffener from the first side of the stiffener to the second side of the stiffener.

In Example 3, the chip package of any one of Examples 1-2 can optionally be configured such that each electrical connection in the plurality of electrical connections includes a vertically-extending member formed from electrically conducting material and laterally surrounded by a dielectric material, the dielectric material electrically shielding the vertically-extending member from the stiffener and from other electrical connections in the plurality of electrical connections.

In Example 4, the chip package of any one of Examples 1-3 can optionally be configured such that each electrical connection is formed by drilling a first hole in the stiffener, filling the first hole with the dielectric material, drilling a second hole in the dielectric material, and filling the second hole with the electrically conductive material.

In Example 5, the chip package of any one of Examples 1-4 can optionally be configured such that the first electrical component includes at least one of an active component, a die, or a stacked die.

In Example 6, the chip package of any one of Examples 1-5 can optionally be configured such that the first electrical component is positioned in a first recess on the first side of the stiffener; the first recess extends over a first recess area on the first side; and the first recess extends to the plurality of electrical connections, each electrical connection extending through the stiffener to the second side of the stiffener.

In Example 7, the chip package of any one of Examples 1-6 can optionally be configured such that the second side of the stiffener is planar; and the first side of the stiffener, away from the first recess, defines a plane that is parallel to the second side.

In Example 8, the chip package of any one of Examples 1-7 can optionally be configured such that the first recess extends only partially into the stiffener; the stiffener has a reduced thickness in the first recess area; and the stiffener has a nominal thickness away from the first recess.

In Example 9, the chip package of any one of Examples 1-8 can optionally be configured such that the reduced and nominal thicknesses differ by an amount greater than a height of the first electrical component, so that when the first electrical component is positioned in the first recess, the first electrical component does not extend beyond the plane defined by the first side of the stiffener.

In Example 10, the chip package of any one of Examples 1-9 can optionally be configured such that the second side of the stiffener is planar; the first side of the stiffener defines a plane that is parallel to the second side; the stiffener is not recessed proximate the first electrical component; and the first electrical component is positioned on the plane, such that the plane is positioned between the first electrical component and the stiffener.

In Example 11, the chip package of any one of Examples 1-10 can optionally further include: a second electrical component positioned on the first side of the stiffener and electrically connected to the build-up layer through the stiffener; wherein the electrically conductive material of the stiffener at least partially shields the build-up layer from at least one of electromagnetic interference or radio-frequency interference from the second electrical component.

In Example 12, the chip package of any one of Examples 1-11 can optionally be configured such that the first electrical component is positioned in a first recess on the first side of the stiffener; the second electrical component is positioned in a second recess on the first side of the stiffener; and the first and second recesses have a same depth.

In Example 13, the chip package of any one of Examples 1-12 can optionally further include a decoupling capacitor positioned on the first side of the stiffener, the decoupling capacitor having a first terminal electrically connected to the build-up layer through the stiffener, the decoupling capacitor having a second terminal electrically connected to the stiffener, the decoupling capacitor electrically coupled to a reference voltage through the stiffener.

In Example 14, the chip package of any one of Examples 1-13 can optionally further include: a memory package facing the first side of the stiffener and electrically connected to the build-up layer through the stiffener, the memory package including at least one memory chip electrically connected to a redistribution layer, the redistribution layer electrically connected via a ball grid array to a second plurality of electrical connections that extend from the first side of the stiffener to the second side of the stiffener; and a molded material that encapsulates the at least one memory chip and secures the at least one memory chip against the redistribution layer.

In Example 15, the chip package of any one of Examples 1-14 can optionally be configured such that the stiffener is electrically connected to a reference voltage.

In Example 16, a method can include: providing a stiffener formed from an electrically conductive material; positioning an active electrical component on a first side of the stiffener; positioning a build-up layer on a second side of the stiffener, opposite the first side; electrically connecting the build-up layer to the active electrical component via electrical connections that extend through the stiffener; and using the stiffener to at least partially shield the build-up layer from at least one of electromagnetic interference or radio-frequency interference produced by the active electrical component.

In Example 17, the method of Examples 16 can optionally be configured such that providing the stiffener includes: providing a body formed from an electrically conductive material; drilling a plurality of first holes through the body; filling the first holes with a dielectric material; forming a plurality of second holes through the dielectric material, the second holes being formed from an etching process, the second holes being positioned to determine locations of the electrical connections that extend through the stiffener; and filling the second holes with an electrically conductive material to form the electrical connections that extend through the stiffener.

In Example 18, a chip package can include: a stiffener formed from an electrically conductive material; an active electrical component positioned on a first side of the stiffener; a build-up layer positioned on a second side of the stiffener, opposite the first side; a plurality of electrical connections extending through the stiffener from the first side of the stiffener to the second side of the stiffener, the electrical connections electrically connecting the build-up layer to the active electrical component; wherein the stiffener at least partially shields the build-up layer from at least one of electromagnetic interference or radio-frequency interference produced by the active electrical component In Example 19, the chip package of Example 18 can optionally be configured such that the active electrical component is positioned in a recess extending into the first side of the stiffener; the second side of the stiffener is planar; the first side of the stiffener, away from the recess, defines a plane that is parallel to the second side; the stiffener has a nominal thickness away from the recess and a reduced thickness in the recess; the difference between the nominal thickness and the reduced thickness is greater than a height of the active electrical component, so that when the active electrical component is positioned in the recess, the active electrical component does not extend beyond the plane defined by the first side of the stiffener.

In Example 20, the chip package of any one of Examples 18-19 can optionally further include a decoupling capacitor positioned on the first side of the stiffener, the decoupling capacitor having a first terminal electrically connected to the build-up layer through the stiffener, the decoupling capacitor having a second terminal electrically connected to the stiffener, the decoupling capacitor electrically coupled to a reference voltage through the stiffener.

What is claimed is:

1. A chip package, comprising:
   a stiffener having a first side and a second side opposite the first side;
   a first electrical component positioned on the first side of the stiffener; and
   a build-up layer positioned on the second side of the stiffener and electrically connected to the first electrical component through the stiffener;
   wherein the stiffener is formed from an electrically conductive material that at least partially shields the build-up layer from at least one of electromagnetic interference or radio-frequency interference from the first electrical component.

2. The chip package of claim 1, wherein the first electrical component is electrically connected to the build-up layer via a plurality of electrical connections that extend through the stiffener from the first side of the stiffener to the second side of the stiffener.

3. The chip package of claim 2, wherein each electrical connection in the plurality of electrical connections includes a vertically-extending member formed from electrically conducting material and laterally surrounded by a dielectric material, the dielectric material electrically shielding the vertically-extending member from the stiffener and from other electrical connections in the plurality of electrical connections.

4. The chip package of claim 3, wherein each electrical connection is formed by drilling a first hole in the stiffener, filling the first hole with the dielectric material, drilling a second hole in the dielectric material, and filling the second hole with the electrically conductive material.

5. The chip package of claim 2, wherein the first electrical component includes at least one of an active component, a die, or a stacked die.

6. The chip package of claim 5, wherein:
the first electrical component is positioned in a first recess on the first side of the stiffener;
the first recess extends over a first recess area on the first side; and
the first recess extends to the plurality of electrical connections, each electrical connection extending through the stiffener to the second side of the stiffener.

7. The chip package of claim 6, wherein:
the second side of the stiffener is planar; and
the first side of the stiffener, away from the first recess, defines a plane that is parallel to the second side.

8. The chip package of claim 7, wherein:
the first recess extends only partially into the stiffener;
the stiffener has a reduced thickness in the first recess area; and
the stiffener has a nominal thickness away from the first recess.

9. The chip package of claim 8, wherein:
the reduced and nominal thicknesses differ by an amount greater than a height of the first electrical component, so that when the first electrical component is positioned in the first recess, the first electrical component does not extend beyond the plane defined by the first side of the stiffener.

10. The chip package of claim 1, wherein:
the second side of the stiffener is planar;
the first side of the stiffener defines a plane that is parallel to the second side;
the stiffener is not recessed proximate the first electrical component; and
the first electrical component is positioned on the plane, such that the plane is positioned between the first electrical component and the stiffener.

11. The chip package of claim 1, further comprising:
a second electrical component positioned on the first side of the stiffener and electrically connected to the build-up layer through the stiffener;
wherein the electrically conductive material of the stiffener at least partially shields the build-up layer from at least one of electromagnetic interference or radio-frequency interference from the second electrical component.

12. The chip package of claim 11, wherein:
the first electrical component is positioned in a first recess on the first side of the stiffener;
the second electrical component is positioned in a second recess on the first side of the stiffener; and
the first and second recesses have a same depth.

13. The chip package of claim 1, further comprising a decoupling capacitor positioned on the first side of the stiffener, the decoupling capacitor having a first terminal electrically connected to the build-up layer through the stiffener, the decoupling capacitor having a second terminal electrically connected to the stiffener, the decoupling capacitor electrically coupled to a reference voltage through the stiffener.

14. The chip package of claim 1, further comprising:
a memory package facing the first side of the stiffener and electrically connected to the build-up layer through the stiffener, the memory package including at least one memory chip electrically connected to a redistribution layer, the redistribution layer electrically connected via a ball grid array to a second plurality of electrical connections that extend from the first side of the stiffener to the second side of the stiffener; and
a molded material that encapsulates the at least one memory chip and secures the at least one memory chip against the redistribution layer.

15. The chip package of claim 1, wherein the stiffener is electrically connected to a reference voltage.

16. A method, comprising:
providing a stiffener formed from an electrically conductive material;
positioning an active electrical component on a first side of the stiffener;
positioning a build-up layer on a second side of the stiffener, opposite the first side;
electrically connecting the build-up layer to the active electrical component via electrical connections that extend through the stiffener; and
using the stiffener to at least partially shield the build-up layer from at least one of electromagnetic interference or radio-frequency interference produced by the active electrical component.

17. The method of claim 16, wherein providing the stiffener comprises:
providing a body formed from an electrically conductive material;
drilling a plurality of first holes through the body;
filling the first holes with a dielectric material;
forming a plurality of second holes through the dielectric material, the second holes being formed from an etching process, the second holes being positioned to determine locations of the electrical connections that extend through the stiffener; and
filling the second holes with an electrically conductive material to form the electrical connections that extend through the stiffener.

18. A chip package, comprising:
a stiffener formed from an electrically conductive material;
an active electrical component positioned on a first side of the stiffener;
a build-up layer positioned on a second side of the stiffener, opposite the first side;
a plurality of electrical connections extending through the stiffener from the first side of the stiffener to the second side of the stiffener, the electrical connections electrically connecting the build-up layer to the active electrical component;
wherein the stiffener at least partially shields the build-up layer from at least one of electromagnetic interference or radio-frequency interference produced by the active electrical component.

19. The chip package of claim 18, wherein:
the active electrical component is positioned in a recess extending into the first side of the stiffener;
the second side of the stiffener is planar;
the first side of the stiffener, away from the recess, defines a plane that is parallel to the second side;

the stiffener has a nominal thickness away from the recess and a reduced thickness in the recess;

the difference between the nominal thickness and the reduced thickness is greater than a height of the active electrical component, so that when the active electrical component is positioned in the recess, the active electrical component does not extend beyond the plane defined by the first side of the stiffener.

20. The chip package of claim 18, further comprising a decoupling capacitor positioned on the first side of the stiffener, the decoupling capacitor having a first terminal electrically connected to the build-up layer through the stiffener, the decoupling capacitor having a second terminal electrically connected to the stiffener, the decoupling capacitor electrically coupled to a reference voltage through the stiffener.

* * * * *